US011469112B2

(12) United States Patent
     Zhang (10) Patent No.: US 11,469,112 B2
(45) Date of Patent: Oct. 11, 2022

(54) DISPLAY SUBSTRATE, MANUFACTURING METHOD THEREOF, DISPLAY PANEL, AND DISPLAY DEVICE

(71) Applicant: BOE TECHNOLOGY GROUP CO., LTD., Beijing (CN)

(72) Inventor: Jianye Zhang, Beijing (CN)

(73) Assignee: BEIJING BOE TECHNOLOGY DEVELOPMENT CO., LTD., Beijing (CN)

(*) Notice: Subject to any disclaimer, the term of this patent is extended or adjusted under 35 U.S.C. 154(b) by 178 days.

(21) Appl. No.: 16/917,527

(22) Filed: Jun. 30, 2020

(65) Prior Publication Data
     US 2021/0013246 A1   Jan. 14, 2021

(30) Foreign Application Priority Data
     Jul. 9, 2019   (CN) .......................... 201910615762.5

(51) Int. Cl.
     *H01L 21/311*   (2006.01)
     *H01L 21/768*   (2006.01)
     *H01L 27/12*    (2006.01)
     *H01L 27/32*    (2006.01)

(52) U.S. Cl.
     CPC .. *H01L 21/31144* (2013.01); *H01L 21/31116* (2013.01); *H01L 21/76804* (2013.01); *H01L 27/1248* (2013.01); *H01L 27/1288* (2013.01); *H01L 27/3258* (2013.01)

(58) Field of Classification Search
     CPC .............. H01L 21/0274; H01L 21/302; H01L 21/31051; H01L 21/31116; H01L 21/31144; H01L 21/32; H01L 21/32134; H01L 21/469; H01L 21/475; H01L 21/768; H01L 21/76804; H01L 21/76838; H01L 21/76877; H01L 21/76895; H01L 27/31144; H01L 27/1248; H01L 27/1259; H01L 27/1288; C23C 16/04; C23C 16/042
     See application file for complete search history.

(56) References Cited

U.S. PATENT DOCUMENTS

| 2006/0290828 A1* | 12/2006 | Hwang | ............... H01L 27/3276 349/43 |
| 2018/0197970 A1* | 7/2018 | Pan | ................... H01L 29/66545 |
| 2019/0115561 A1* | 4/2019 | Tang | ................... H01L 27/3258 |

* cited by examiner

*Primary Examiner* — Cheung Lee
(74) *Attorney, Agent, or Firm* — Womble Bond Dickinson (US) LLP (57) ABSTRACT

A display substrate, a manufacturing method thereof, a display panel, and a display device are provided. The method for manufacturing a display substrate includes: forming a thin film transistor on a base substrate; forming a planarization layer covering the thin film transistor; forming a metal mask layer on the planarization layer; patterning the metal mask layer to form an etching hole in the metal mask layer, the etching hole exposing a portion of the planarization layer; etching the portion of the planarization layer exposed by the etching hole to form a first via hole penetrating the planarization layer, and removing a remaining metal mask layer on the planarization layer.

16 Claims, 6 Drawing Sheets

DISPLAY SUBSTRATE, MANUFACTURING METHOD THEREOF, DISPLAY PANEL, AND DISPLAY DEVICE

RELATED APPLICATION

The present application claims the benefit of Chinese Patent Application No. 201910615762.5, filed on Jul. 9, 2019, the entire disclosure of which is incorporated herein by reference.

TECHNICAL FIELD

The present disclosure relates to the field of display technologies, particularly to a display substrate, a manufacturing method thereof, a display panel, and a display device.

BACKGROUND

With the continuous development of display technology, display products are gradually developing toward high resolution, high color gamut, high image quality and long service life. An OLED (Organic Light Emitting Diode) display panel formed by an inkjet printing process has advantages of better performance and longer service life compared with an OLED display panel formed by an evaporation process, which is especially suitable for large-sized display products.

SUMMARY

An embodiment of the present disclosure provides a method for manufacturing a display substrate, comprising: forming a thin film transistor on a base substrate; forming a planarization layer covering the thin film transistor; forming a metal mask layer on the planarization layer; patterning the metal mask layer to form an etching hole in the metal mask layer, the etching hole exposing a portion of the planarization layer; etching the portion of the planarization layer exposed by the etching hole to form a first via hole penetrating the planarization layer, and removing the remaining metal mask layer on the planarization layer.

According to some embodiments of the present disclosure, the method for manufacturing a display substrate further comprises: prior to forming the planarization layer, forming, above the base substrate, a passivation layer covering the thin film transistor; and etching a portion of the passivation layer corresponding to the etching hole to form a second via hole penetrating the passivation layer, the second via hole communicating with the first via hole.

According to some embodiments of the present disclosure, a material of the metal mask layer comprises Cu or AlNd.

According to some embodiments of the present disclosure, processes of forming the first via hole and removing the remaining metal mask layer comprise: etching the portion of the planarization layer exposed by the etching hole using a first etching process to form the first via hole; removing the remaining metal mask layer on the planarization layer using a second etching process different from the first etching process.

According to some embodiments of the present disclosure, a process of forming the second via hole comprises: coating a photoresist on the planarization layer from which the remaining metal mask layer has been removed; patterning the photoresist to expose the first via hole; etching a portion of the passivation layer exposed by the first via hole using a third etching process to form the second via hole; and removing the photoresist on the planarization layer.

According to some embodiments of the present disclosure, the first etching process and the third etching process both comprise a dry etching process using a mixed gas of $CF_4$ and $O_2$ as an etching gas; the second etching process comprises a wet etching process using an acidic solution as an etching solution.

According to some embodiments of the present disclosure, a material of the metal mask layer comprises Au.

According to some embodiments of the present disclosure, processes of forming the first via hole and the second via hole, and removing the remaining metal mask layer comprise: etching the portion of the planarization layer exposed by the etching hole and a portion of the passivation layer corresponding to the etching hole using a fourth etching process to form the first via hole and the second via hole that communicate with each other; removing the remaining metal mask layer on the planarization layer using a fifth etching process different from the fourth etching process.

According to some embodiments of the present disclosure, the fourth etching process comprises a dry etching process using a mixed gas of $CF_4$ and $O_2$ as an etching gas; the fifth etching process comprises a wet etching process using a mixed solution of $I_2$, KI and water as an etching solution.

According to some embodiments of the present disclosure, a gas flow ratio of $CF_4$ to $O_2$ in the mixed gas is 4:1 to 5:1.

According to some embodiments of the present disclosure, the metal mask layer has a thickness ranging from 3000 Å to 5000 Å.

According to some embodiments of the present disclosure, a thickness of the passivation layer is smaller than a thickness of the planarization layer.

According to some embodiments of the present disclosure, an orthographic projection of the etching hole on the base substrate at least partially overlaps an orthographic projection of a source or drain of the thin film transistor on the base substrate.

According to some embodiments of the present disclosure, a process of forming the thin film transistor on the base substrate comprises: forming a light shielding layer on the base substrate by a patterning process; forming a buffer layer covering the light shielding layer; forming an active layer on the buffer layer by a patterning process; forming a gate insulating layer and a gate successively on the active layer by a patterning process; forming an interlayer dielectric layer by a patterning process, the interlayer dielectric layer covering the buffer layer, the active layer, the gate insulating layer and the gate; forming a source and a drain on the interlayer dielectric layer by a patterning process, the source and the drain being connected to the active layer through via holes in the interlayer dielectric layer respectively.

Another embodiment of the present disclosure provides a display substrate manufactured by the method for manufacturing a display substrate descried in any one of the foregoing embodiments, the first via hole and the second via hole communicate with each other, and a size of a top opening of the first via hole is greater than a size of a top opening of the second via hole.

According to some embodiments of the present disclosure, a slope angle of the first via hole is smaller than a slope angle of the second via hole.

A further embodiment of the present disclosure provides a display panel comprising the display substrate described in the above embodiment.

Yet another embodiment of the present disclosure provides display device comprising the display panel described in the above embodiment.

DETAILED DESCRIPTION OF EMBODIMENTS

In order to make the above objects, features and advantages of the present disclosure more obvious and understandable, the present disclosure will be further described in detail below in conjunction with the accompanying drawings and specific embodiments.

If an organic light emitting device is fabricated on a display substrate by means of an inkjet printing process, the display substrate is usually required to have good flatness. During the actual manufacturing process, in order to decrease an IR drop (voltage drop) across a large-sized display panel, it is necessary to increase the thicknesses of the source/drain and the gate of the thin film transistor, which in turn increases the step differences between the film layers of the display substrate, resulting in degradation in flatness. In order to improve the flatness of the display substrate, the planarization layer needs to have an increased thickness. Further, for increasing the capacitance between the source/drain and the anode to reduce the parasitic capacitance, it is also necessary to increase the thickness of the planarization layer. As a result, the thickness of the planarization layer in the display substrate will be relatively large.

Inventors of the present application have realized that, in order to form a via hole in a relatively thick planarization layer, the photoresist coated on the planarization layer have to have a large thickness, which tends to make thickness of the coated photoresist non-uniform, so that a phenomenon of incomplete etching or over-etching is likely to occur during a subsequent process of forming a via hole penetrating the planarization layer, thereby affecting the yield of the display panel.

Specifically, it takes a long time for etching a thick planarization layer to form a via hole penetrating the planarization layer, the photoresist coated on the planarization layer is also required to have a large thickness. The larger the thickness of the coated photoresist is, the slower the coating speed will be, which results in non-uniform coating of the photoresist. Moreover, since the photoresist and the planarization layer usually are both made of an organic material, the planarization layer is prone to cross-link the solvent in the photoresist, which will further cause non-uniform coating of the photoresist. Where the photoresist is coated thickly, the photoresist will not be completely removed after exposure and development, which results in subsequent incomplete etching of the planarization layer. Where the photoresist is coated thinly, after exposure and development, part of the planarization layer will even be removed during the process of removing the photoresist, which would result in subsequent over-etching of the planarization layer and makes it difficult to perform subsequent processes, thereby affecting the yield of the display panel.

Figure 1:
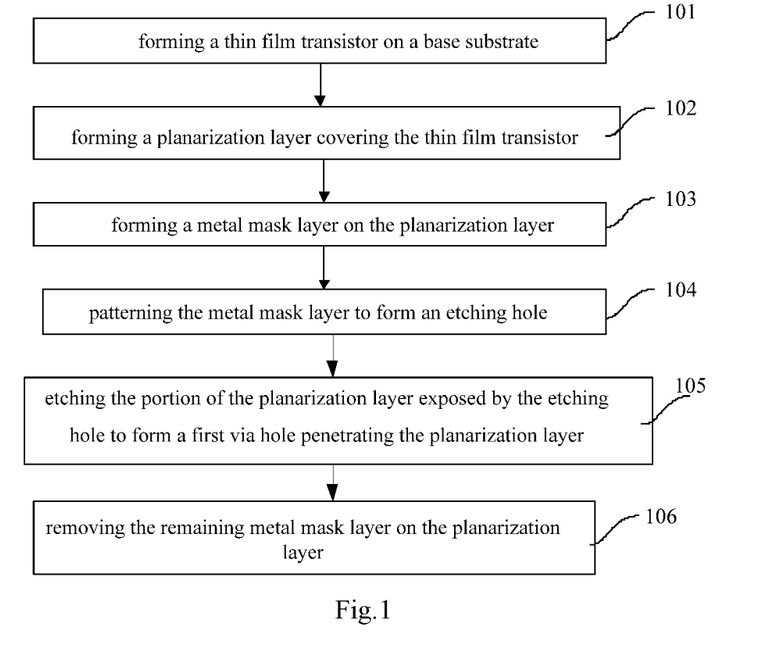
FIG. 1 shows a flow chart of a method for manufacturing a display substrate according to an embodiment of the present disclosure.

In view of this, an embodiment of the present disclosure proposes a method for manufacturing a display substrate to mitigate or alleviate the above-mentioned problems. As shown in FIG. 1, a method for manufacturing a display substrate according to an embodiment of the present disclosure comprises: 101, forming a thin film transistor on a base substrate; 102, forming a planarization layer covering the thin film transistor; 103, forming a metal mask layer on the planarization layer; 104, patterning the metal mask layer to form an etching hole in the metal mask layer, the etching hole exposing a portion of the planarization layer; 105, etching the portion of the planarization layer exposed by the etching hole to form a first via hole penetrating the planarization layer; 106, removing the remaining metal mask layer on the planarization layer.

The method for manufacturing a display substrate described in the above embodiment does not indicate that manufacturing a display substrate may only include the above steps. In actual production practice, additional steps may be involved as need. For example, according to some embodiments of the present disclosure, the display substrate may further comprise a passivation layer. In this case, the method for manufacturing a display substrate further comprises: prior to forming the planarization layer, forming, above the base substrate, a passivation layer covering the thin film transistor; and etching a portion of the passivation layer corresponding to the etching hole to form a second via hole penetrating through the passivation layer, the second via hole communicating with the first via hole. Furthermore, the execution order of the steps is not limited in the embodiments of the method as shown in FIG. 1 and other drawings mentioned later, and some of these steps may be combined as needed.

The method for manufacturing a display substrate proposed by an embodiment of the present disclosure will be described in detail below with reference to the drawings and specific examples.

Figure 2:
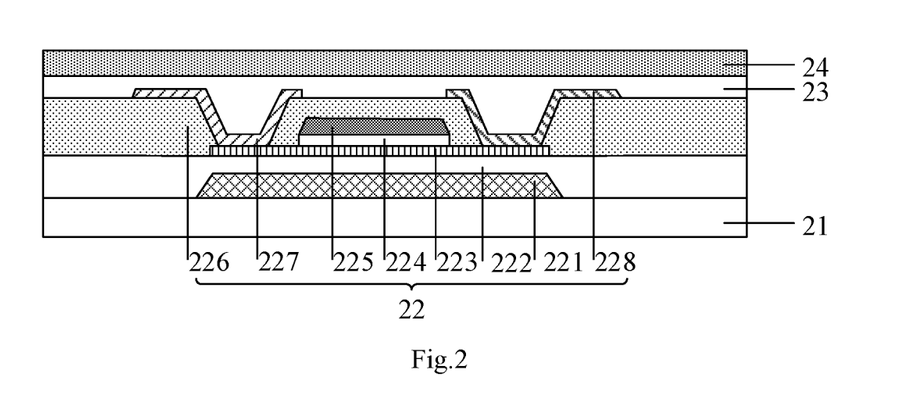
FIG. 2 shows a schematic view illustrating a structure obtained by forming a thin film transistor, a passivation layer and a planarization layer successively on a base substrate according to an embodiment of the present disclosure.

FIG. 2 shows a view illustrating formation of a thin film transistor, a passivation layer and a planarization layer on a base substrate according to an embodiment of the present disclosure. As shown in FIG. 2, firstly, a base substrate 21 is provided, which may be a PI (polyimide) substrate or a glass substrate, and a thin film transistor 22 is formed on the base substrate 21.

The thin film transistor 22 comprises a light shielding layer 221 on the base substrate 21, a buffer layer 222 covering the light shielding layer 221, an active layer 223 on the buffer layer 222, a gate insulating layer 224 on the active layer 223, a gate 225 on the gate insulating layer 224, an interlayer dielectric layer 226 covering the buffer layer 222, the active layer 223, the gate insulating layer 224 and the gate 225, and a source 227 and a drain 228 on the interlayer dielectric layer 226, the source 227 and the drain 228 being connected to the active layer 223 through via holes in the interlayer dielectric layer 226 respectively.

The material of the light shielding layer 221 may comprise Mo, the material of the buffer layer 222 may comprise silicon oxide, silicon nitride or silicon oxynitride, the material of the active layer 223 may comprise IGZO (Indium Gallium Zinc Oxide), the material of the gate insulating layer 224 may comprise silicon oxide or silicon nitride, the material of the gate 225 may comprise a metal material such as aluminum, aluminum alloy and copper, the material of the interlayer dielectric layer 226 may comprise silicon oxide or silicon nitride, and the material of the source 227 and the drain 228 may be a metal material such as aluminum, aluminum alloy and copper.

In some embodiments, the above step 101 may comprise: forming a light shielding layer on the base substrate by a patterning process; forming a buffer layer covering the light shielding layer; forming an active layer on the buffer layer by a patterning process; forming a gate insulating layer and a gate successively on the active layer by a patterning process; forming an interlayer dielectric layer by a patterning process, the interlayer dielectric layer covering the buffer layer, the active layer, the gate insulating layer and the gate; forming a source and a drain on the interlayer dielectric layer by a patterning process, the source and the drain being connected to the active layer through via holes in the interlayer dielectric layer respectively.

Firstly, a light shielding layer 221 is formed on the base substrate 21 by a patterning process. Specifically, a light shielding layer film may be deposited on the base substrate 21 by a sputtering process, a photoresist is coated on the light shielding layer film, the photoresist is subjected to exposure and development, the light shielding layer film is etched, and the remaining photoresist on the light shielding layer film is stripped off to form a light shielding layer 221 on the base substrate 21. Then, a buffer layer 222 is deposited using a PECVD (Plasma Enhanced Chemical Vapor Deposition) process or other deposition processes, an active layer film is deposited on the buffer layer 222, and the active layer film is patterned to form an active layer 223. Next, a gate insulating layer film is deposited on the active layer 223, and the gate insulating layer film is patterned to form a gate insulating layer 224; a gate film is deposited on the gate insulating layer 224, and the gate film is patterned to form a gate 225. Then, an interlayer dielectric layer film is deposited, and the interlayer dielectric layer film is patterned to form a via hole penetrating the interlayer dielectric layer 226. The interlayer dielectric layer 226 covers the buffer layer 222, the active layer 223, the gate insulating layer 224, and the gate 225. Finally, a source/drain metal film is deposited on the interlayer dielectric layer 226, and the source/drain metal film is patterned to form a source 227 and a drain 228. The source 227 and the drain 228 are connected to the active layer 223 through via holes in the interlayer dielectric layer 226 respectively.

After the thin film transistor is formed, a passivation layer and a planarization layer are formed successively. The passivation layer covers the thin film transistor, and the planarization layer covers the passivation layer.

As shown in FIG. 2, after the thin film transistor 22 is formed on the base substrate 21, a passivation layer 23 covering the thin film transistor 22 is formed, and a planarization layer 24 covering the passivation layer 23 is subsequently formed.

The material of the passivation layer 23 comprises silicon nitride or silicon oxide, and the passivation layer 23 may be formed by a PECVD process or other deposition processes. The material of the planarization layer 24 comprises thermosetting material such as organosiloxane. The thickness of the planarization layer 24 ranges from 2.5 µm to 3.5 µm. The planarization layer 24 may be formed on the passivation layer 23 using a coating process or a spin coating process.

Figure 3:
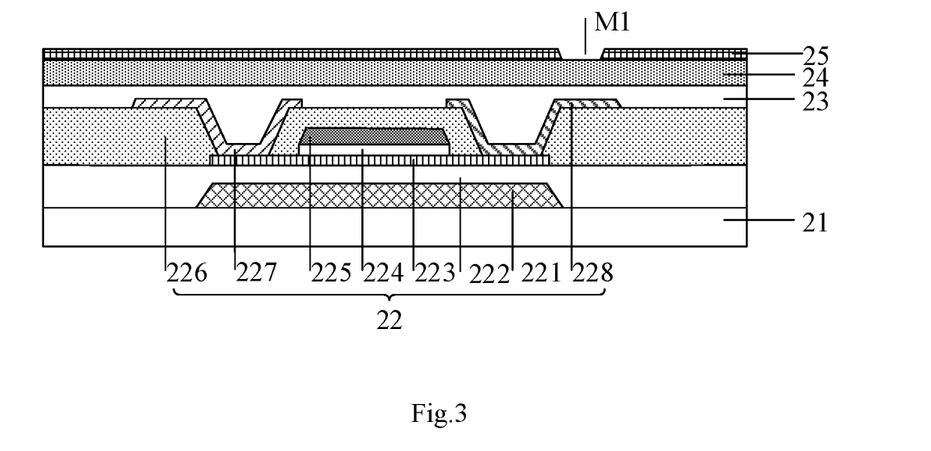
FIG. 3 shows a schematic view illustrating a structure obtained by patterning the metal mask layer formed on the planarization layer according to an embodiment of the present disclosure.

FIG. 3 schematically shows a metal mask layer in which an etching hole is formed. As shown in FIG. 3, a metal mask layer 25 is formed on the planarization layer 24 using a sputtering process, a photoresist is coated on the metal mask layer 25, the photoresist coated on the metal mask layer 25 is exposed by means of a mask plate and developed, the metal mask layer 25 is then etched to form an etching hole M1 penetrating the metal mask layer 25. Finally, the remaining photoresist on the metal mask layer 25 is removed.

According to an embodiment of the disclosure, the orthographic projection of the etching hole M1 on the base substrate at least partially overlaps the orthographic projection of the source or drain of the thin film transistor on the base substrate. For example, an etching hole M1 penetrating the metal mask layer 25 may be formed at a position of the metal mask layer 25 corresponding to the drain 228 of the thin film transistor 22, that is, the orthographic projection of the etching hole M1 on the base substrate 21 is within the orthographic projection of the drain 228 of the thin film transistor 22 on the base substrate 21.

By adding a metal mask layer 25 on the planarization layer 24, when the metal mask layer 25 is being patterned to form the etching hole M1, it is the metal mask layer 25 that is coated with the photoresist. The metal mask layer 25 will not cross-link the solvent in the photoresist, so that coated photoresist will be uniform. Moreover, since the metal mask layer 25 is used as a mask plate for etching the planarization layer 24 and the passivation layer 23 later, the photoresist coated on the metal mask layer 25 does not need to be very thick, so that the coating the photoresist is performed faster, and the coated photoresist is also more uniform, thus forming the etching hole M1 will not lead to a phenomenon of incomplete etching or over-etching. Furthermore, due to the protection of the metal mask layer 25, when the photoresist coated on the metal mask layer 25 is being subjected to exposure and development, there is no influence on the planarization layer 24 and the passivation layer.

According to some embodiments of the disclosure, the thickness of the metal mask layer 25 ranges from 3000 Å to 5000 Å. In some embodiments, the material of the metal mask layer 25 includes Cu or AlNd. In another embodiment, the material of the metal mask layer 25 includes Au.

When the material of the metal mask layer 25 includes Cu or AlNd, the metal mask layer 25 may be etched using an acidic solution to form the etching hole M1. For example, the acidic solution may be a mixed liquid of phosphoric acid, nitric acid, acetic acid, and hydrochloric acid. When the material of the metal mask layer 25 includes Au, the metal mask layer 25 may be etched using a mixed solution of $I_2$, KI and water to form the etching hole M1.

On the basis of forming the etching hole M1, the portion of the planarization layer that is exposed by the etching hole may be etched to form a first via hole penetrating the planarization layer, and the portion of the passivation layer corresponding to the etching hole may be etched to form a second via hole penetrating the passivation layer. The second via hole communicates with the first via hole, and the remaining metal mask layer on the planarization layer is removed.

Forming the etching hole M1 will not lead to incomplete etching or over-etching, when the planarization layer 24 and the passivation layer 23 are etched through the etching hole M1 to form the first via hole penetrating the planarization layer 24 and the second via hole penetrating the passivation layer 23, the phenomenon of incomplete etching or over-etching will not occur either. Moreover, when the first via hole and the second via hole are formed by etching, the etching gas used is not likely to etch the metal mask layer 25, so that the planarization layer 24 and the passivation layer 23 outside the etching hole M1 will not be etched away, so that subsequent processes may be performed normally, thereby improving the yield of the display panel.

Figure 4:
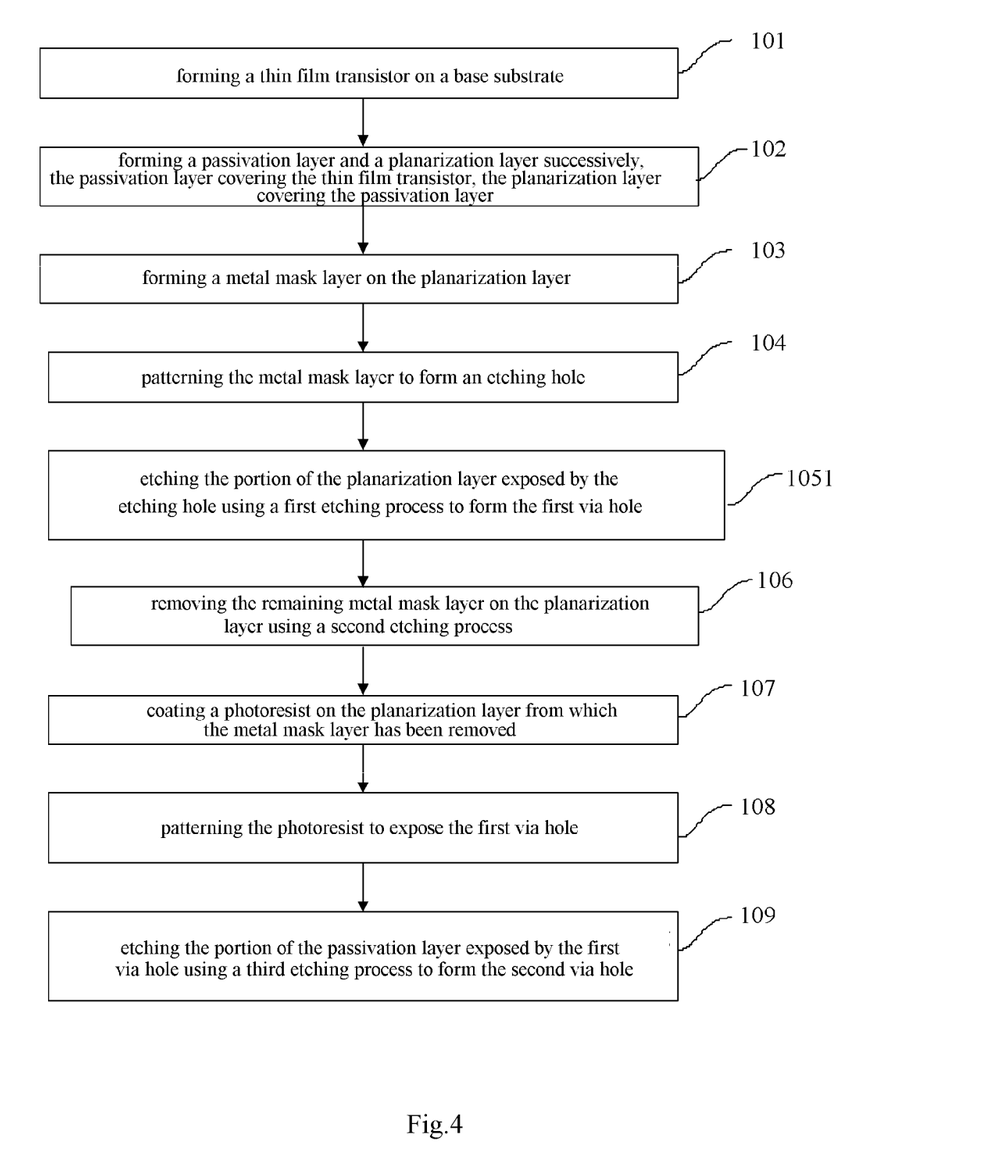
FIG. 4 shows a specific flow chart of a method for manufacturing a display substrate according to an embodiment of the present disclosure.

FIG. 4 shows an example of a specific flow chart of a method for manufacturing a display substrate according to an embodiment of the present disclosure. In this example, if the material of the metal mask layer 25 includes Cu or AlNd, the processes of forming the first via hole and removing the remaining metal mask layer may include the following steps: 1051, etching the portion of the planarization layer that is exposed by the etching hole using a first etching process to form the first via hole; 106, removing the remaining metal mask layer on the planarization layer using a second etching process different from the first etching process.

According to an embodiment of the present disclosure, the process of forming the second via hole may include: 107, coating a photoresist on the planarization layer from which the remaining metal mask layer has been removed; 108, patterning the photoresist to expose the first via hole; 109, etching the portion of the passivation layer that is exposed by the first via hole using a third etching process to from the second via hole. Finally, the photoresist on the planarization layer may be removed.

FIGS. 5 to 8 illustrate a process of fabricating the first via hole and the second via hole in the display substrate according to an embodiment of the present disclosure.

Figure 5:
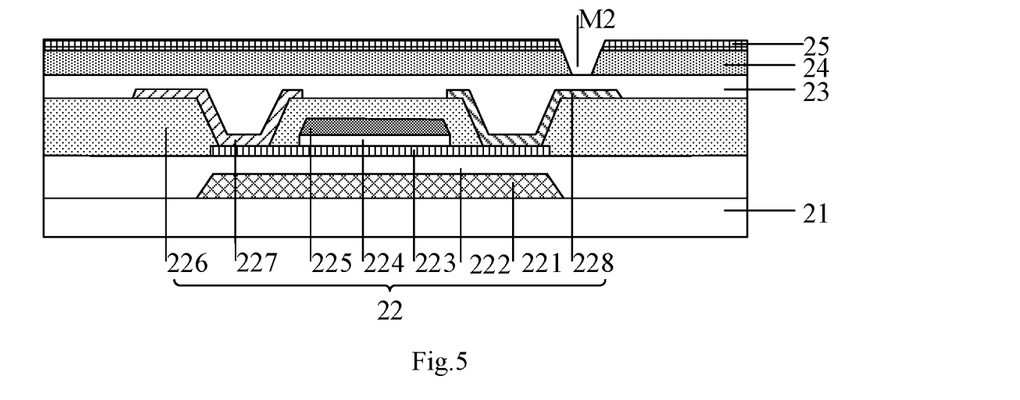
FIG. 5 shows a schematic view illustrating a structure obtained by etching the planarization layer within the etching hole using a first etching process according to an embodiment of the present disclosure.

As shown in FIG. 5, the planarization layer 24 exposed by the etching hole M1 is etched using a first etching process to form a first via hole M2 penetrating the planarization layer 24. According to an embodiment of the present disclosure, the first etching process comprises a dry etching process, the etching gas used is a mixed gas of $CF_4$ and $O_2$, and the gas flow ratio of $CF_4$ to $O_2$ in the mixed gas is 4:1 to 5:1.

Since the metal mask layer 25 is not likely to be etched by the etching gas used in the first etching process when the planarization layer 24 exposed by the etching hole M1 is being etched, the planarization layer 24 other than the portion corresponding to the first via hole M2 will not be etched away.

Figure 6:
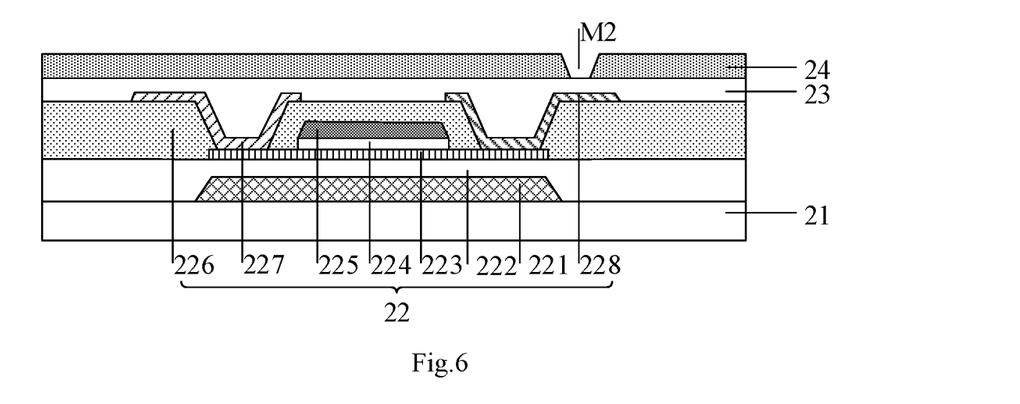
FIG. 6 shows a schematic view illustrating a structure obtained by removing the remaining metal mask layer on the planarization layer using a second etching process according to an embodiment of the present disclosure.

As shown in FIG. 6, the remaining metal mask layer 25 on the planarization layer 24 is removed using a second etching process. According to an embodiment of the present disclosure, the second etching process comprises a wet etching process, and the etching solution used is an acidic solution, for example, the acidic solution may be a mixed liquid of phosphoric acid, nitric acid, acetic acid, and hydrochloric acid.

Figure 7:
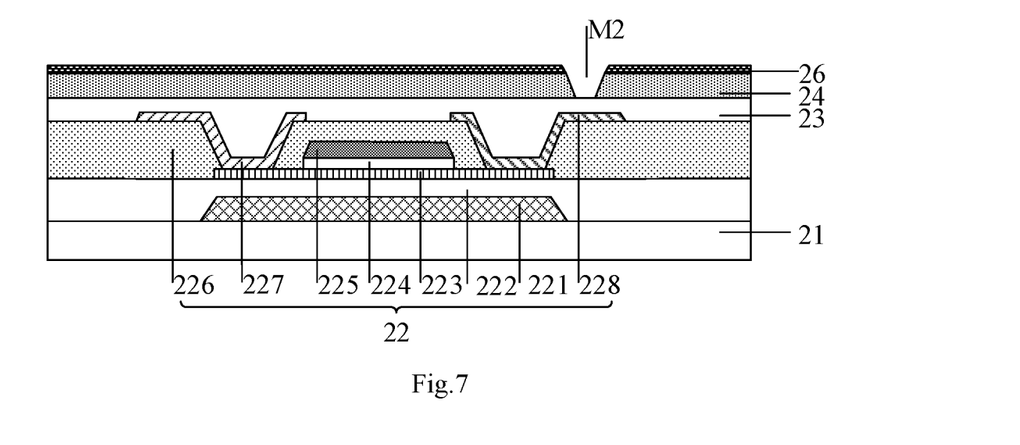
FIG. 7 shows a schematic view illustrating a structure obtained by patterning the photoresist coated on the planarization layer according to an embodiment of the present disclosure.

As shown in FIG. 7, after the remaining metal mask layer 25 on the planarization layer 24 is removed, it is further required to etch the portion of passivation layer 23 exposed by the first via hole M2 in a direction perpendicular to the base substrate 21. According to an embodiment of the disclosure, a photoresist 26 is coated on the planarization layer 24, and then the photoresist 26 is patterned to remove the photoresist 26 filled in the first via hole M2.

When the photoresist 26 is coated on the planarization layer 24, the photoresist 26 fills the first via hole M2 etched previously in the planarization layer 24. However, the photoresist 26 in the first via hole M2 may be removed by performing exposure and development on the photoresist 26 coated on the planarization layer 24 using a mask plate. In order that the photoresist 26 filled in the first via hole M2 may be removed as much as possible, the aperture of the region where the photoresist 26 is removed by exposure and development may be larger than the aperture of the first via hole M2.

According to an embodiment of the disclosure, the thickness of the passivation layer 23 is small, for example, about 3000 Å, which is much smaller than the thickness of the planarization layer 24. In this way, when the passivation layer 23 exposed by the first via hole M2 is subsequently etched, the etching time is short. Therefore, after the remaining metal mask layer 25 on the planarization layer 24 is removed, the photoresist 26 coated on the planarization layer 24 is not thick, so that the coating speed of the photoresist 26 is faster, and a more uniform coated photoresist 26 is obtained, which will not lead to the phenomenon of incomplete etching or over-etching resulting from non-uniform coated photoresist 26 when the passivation layer 23 is being etched subsequently.

Figure 8:
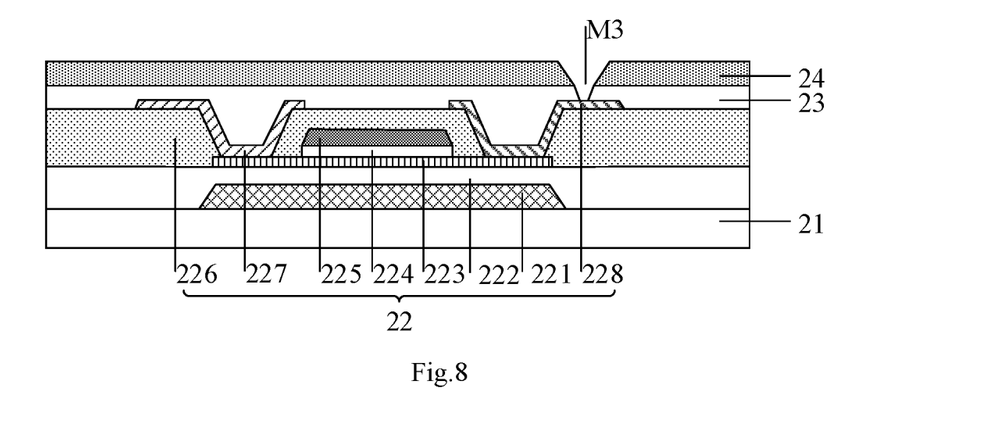
FIG. 8 shows a schematic view illustrating a structure obtained by etching the passivation layer within the first via hole using a third etching process according to an embodiment of the present disclosure.

As shown in FIG. 8, the passivation layer 23 exposed by the first via hole M2 is etched using a third etching process to form a second via hole M3 penetrating the passivation layer 23. After the etching is completed, the remaining photoresist 26 on the planarization layer 24 is stripped off to obtain a display substrate. According to an embodiment of the present disclosure, the third etching process comprises a dry etching process, the etching gas used is a mixed gas of $CF_4$ and $O_2$, and the gas flow ratio of $CF_4$ to $O_2$ in the mixed gas is 4:1 to 5:1.

After etching the planarization layer 24 exposed by the etching hole M1 using a first etching process to form the first via hole M2 penetrating the planarization layer 24, it is required to firstly remove a remaining metal mask layer 25 on the planarization layer 24, and then etch the passivation layer 23 exposed by the first via hole M2. If the portions of the planarization layer 24 and the passivation layer 23 that are exposed by the etching hole M1 are continuously etched to form the first via hole and the second via hole at one time, the drain 228 at the second via hole M3 will be etched during the process of removing the remaining metal mask layer 25 on the planarization layer 24 with an acidic solution, resulting in a failure in manufacturing a display substrate.

According to the embodiment of the present disclosure, since the first via hole and the second via hole are formed through two different etching processes respectively, and the region of the planarization layer 24 where the photoresist 26 is removed has a size larger than that of the first via hole M2, when the passivation layer 23 exposed by the first via hole M2 is being etched, part of the planarization layer 24 will be etched away, so that the slope angle of the first via hole in the planarization layer 24 is smaller than the slope angle of the second via hole in the passivation layer 23, that is, the first via hole is gentler, which may achieve a better bonding between the electrode material and the drain 228 when the electrode material is formed at the first via hole and the second via hole.

Figure 9:
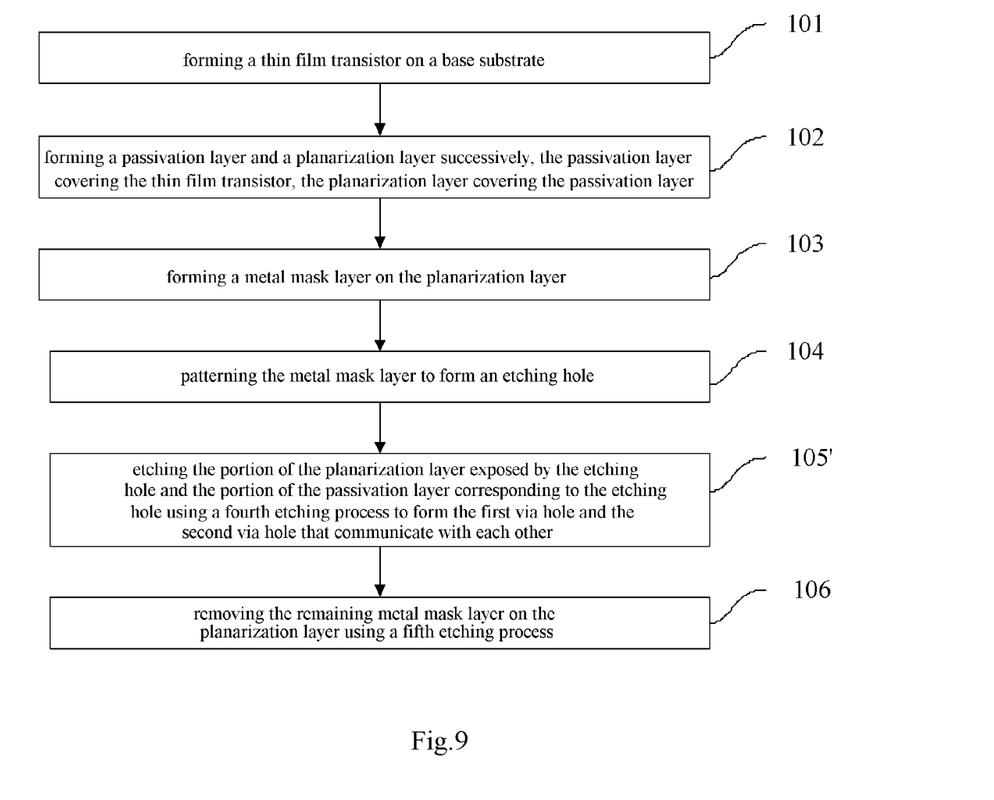
FIG. 9 shows a specific flow chart of a method for manufacturing a display substrate according to another embodiment of the present disclosure.

FIG. 9 shows a specific flow chart of a method for manufacturing a display substrate according to another embodiment of the present disclosure.

According to an embodiment of the disclosure, the material of the metal mask layer includes Au, and the above step 105 may be replaced by step 105'. The step 105' may include: etching the portion of the planarization layer that is exposed by the etching hole and the portion of the passivation layer corresponding to the etching hole using a fourth etching process to form the first via hole and the second via hole that communicate with each other. Thereafter, at step 106, a remaining metal mask layer on the planarization layer is removed using a fifth etching process different from the fourth etching process.

Figure 10:
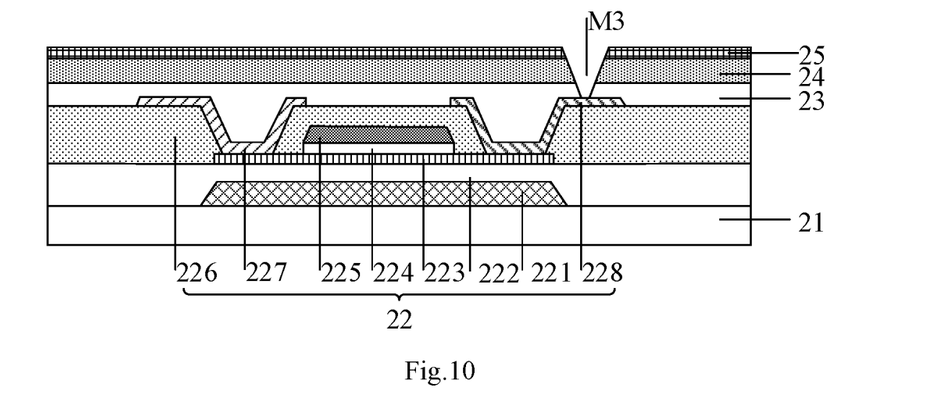
FIG. 10 shows a schematic view illustrating a structure obtained by etching the planarization layer and the passivation layer within the etching hole using a fourth etching process according to another embodiment of the present disclosure.
Figure 11:
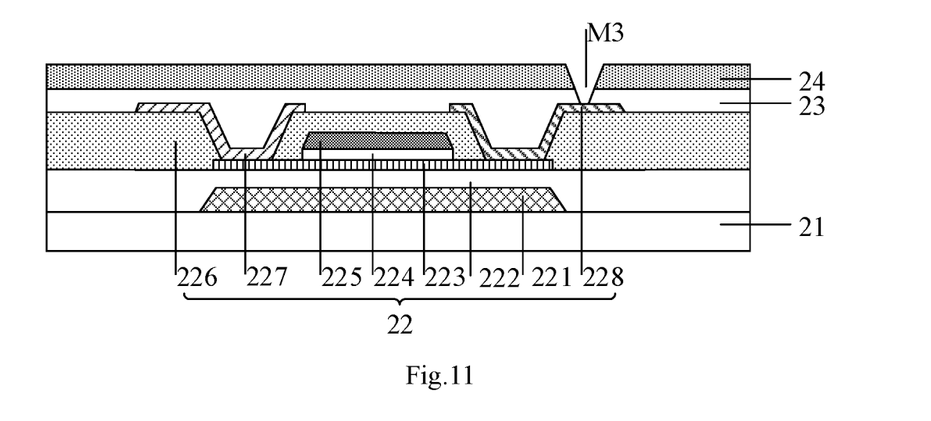
FIG. 11 shows a schematic view illustrating a structure obtained by removing the remaining metal mask layer on the planarization layer using a fifth etching process according to another embodiment of the present disclosure.

FIGS. 10 to 11 are schematic views of manufacturing a display substrate provided by another embodiment of the present disclosure.

As shown in FIG. 10, the planarization layer 24 and the passivation layer 23 exposed by the etching hole M1 are etched using a fourth etching process to form a first via hole penetrating the planarization layer 24 and a second via hole penetrating the passivation layer 23, and the first via hole and the second via hole communicate with each other. According to an embodiment of the disclosure, the fourth etching process is a dry etching process, the etching gas used is a mixed gas of $CF_4$ and $O_2$, and the gas flow ratio of $CF_4$ to $O_2$ in the mixed gas is 4:1 to 5:1.

Since the metal mask layer 25 is not likely to be etched by the etching gas used in the fourth etching process when the planarization layer 24 and the passivation layer 23 exposed by the etching hole M1 are being etched, the planarization layer 24 and the passivation layer 23 other than the portions corresponding to the first via hole and the second via hole will not be etched away.

As shown in FIG. 11, a remaining metal mask layer 25 on the planarization layer 24 is removed using a fifth etching process. The fifth etching process is a wet etching process, and the etching solution used is a mixed solution of $I_2$, KI and water. The molar ratio of $I_2$, KI and water in the mixed solution is 1:2:8.

Since the mixed solution of $I_2$, KI and water does not etch the drain 228, the first via hole and the second via hole penetrating the planarization layer 24 and the passivation layer 23 may be formed by etching in one step, and then the remaining metal mask layer 25 on the planarization layer 24 is removed by the mixed solution of $I_2$, KI and water, which saves the process time and reduces the number of mask plates to be used.

For the display substrates shown in FIGS. 8 and 11, they mainly differ in the shape of the first via hole. The first via hole shown in FIG. 8 is gentler.

In embodiments of the disclosure, during the process of manufacturing a display substrate, a metal mask layer is provided on the planarization layer, and the photoresist is coated on the metal mask layer during the process of patterning the metal mask layer to form the etching hole. The metal mask layer will not cross-link the solvent in the photoresist, so that the coated photoresist is more uniform. Moreover, since the metal mask layer is used as a mask plate for etching the planarization layer and the passivation layer, the photoresist coated on the metal mask layer does not need to be very thick, so that the coating speed of the photoresist is faster, and thus the coated photoresist is more uniform. Therefore, the formed etching hole will not lead to a phenomenon of incomplete etching or over-etching. When the planarization layer and the passivation layer are subsequently etched through the etching hole to form via holes that penetrate the planarization layer and the passivation layer, the phenomenon of incomplete etching or over-etching will not occur either. Furthermore, the etching gas is not likely to etch the metal mask layer, so that the portions of the planarization layer and the passivation layer outside the etching hole will not be etched, and subsequent process may be performed normally, thereby improving the yield of the display panel.

Another embodiment of the disclosure provides a display substrate manufactured by the method for manufacturing a display substrate as described in any one of the foregoing embodiments. The first via hole in the planarization layer and the second via hole in the passivation layer communicate with each other, and the size of the top opening of the first via hole is greater than the size of the top opening of the second via hole. Examples of the manufactured display substrate are shown in FIG. 8 or FIG. 11.

According to some embodiments of the present disclosure, the slope angle of the first via hole is smaller than the slope angle of the second via hole. As shown in FIG. 8, the slope angle of the first via hole in the planarization layer is smaller than that of the second via hole in the passivation layer, which makes the first via hole gentler than the second via hole.

An embodiment of the present disclosure further provides a display panel, comprising the display substrate described in the above embodiment.

After the display substrate shown in FIG. 8 or FIG. 11 is obtained, a pixel electrode (for example, an anode) may be formed on the planarization layer 24. The anode is connected to the drain 228 through the first via hole and the second via hole. Thereafter, film layers such as a pixel defining layer, an organic light emitting layer, a cathode, and the like are fabricated successively to obtain a display panel.

An embodiment of the present disclosure further provides a display device comprising the above display panel.

The display device is an OLED display device. The OLED display device may be applied to any display device with a display function such as a mobile phone, a tablet computer, a television, a display, a notebook computer, a navigator, and the like.

During the process of manufacturing the display panel or display device of the present invention, a metal mask layer is arranged on the planarization layer, the photoresist is coated on the metal mask layer so as to pattern the metal mask layer to form the etching hole. The metal mask layer will not cross-link the solvent in the photoresist, so that the coated photoresist is more uniform. Moreover, since the metal mask layer is used as a mask plate for etching the planarization layer and the passivation layer, the photoresist coated on the metal mask layer does not need to be very thick, so that the coating speed of the photoresist is faster, and the coated photoresist is more uniform, thus the formed etching hole will not involve a phenomenon of incomplete etching or over-etching. When the planarization layer and the passivation layer are subsequently etched through the etching hole to form via holes that penetrate the planarization layer and the passivation layer, the phenomenon of incomplete etching or over-etching will not occur either. Furthermore, the etching gas is not likely to etch the metal mask layer, so that the portions of the planarization layer and the passivation layer outside the etching hole will not be etched, and subsequent process may be performed normally, thereby improving the yield of the display panel.

For the foregoing method embodiments, for the sake of simple description, they are all expressed as a combination of a series of steps. However, those skilled in the art should know that the present disclosure is not limited by the described order of steps, because according to the disclosure, some steps may be performed in other orders or simultaneously. Finally, it is to be noted that in this text, relational terms such as "first" and "second" are used only to distinguish one entity or operation from another entity or operation, and do not necessarily require or imply that these entities or operations have such actual relationship or order. Moreover, the term "include", "comprise" or any other variant thereof is intended to encompass non-exclusive inclusion, so that a process, a method, an article or device that includes a series of elements includes not only those elements, but also other elements not explicitly listed, or elements that are inherent to the process, method, article, or device. Without more restrictions, an element defined by the statement "including a . . . " does not exclude presence of other identical elements in a process, method, commodity, or device that includes said element.

Embodiments of the display substrate, the manufacturing method thereof, the display panel and the display device provided by the present disclosure have been described in detail above. The descriptions of the above embodiments are only used to help to understand the method and the core concept of the present disclosure, but not to limit the protection scope of this patent application. For a person having an ordinary skill in the art, many modifications or variations may be made to the specific embodiments based on the concepts revealed herein, and these modifications or variations are also encompassed within the protection scope of this patent application.

The invention claimed is:

1. A method for manufacturing a display substrate, comprising:
    forming a thin film transistor on a base substrate;
    forming a planarization layer covering the thin film transistor;
    forming a metal mask layer on the planarization layer;
    patterning the metal mask layer to form an etching hole in the metal mask layer, the etching hole exposing a portion of the planarization layer;
    etching the portion of the planarization layer exposed by the etching hole to form a first via hole penetrating the planarization layer;
    removing a remaining metal mask layer on the planarization layer;
    forming, above the base substrate, a passivation layer covering the thin film transistor prior to forming the planarization layer; and
    etching a portion of the passivation layer corresponding to the etching hole to form a second via hole penetrating the passivation layer, the second via hole communicating with the first via hole, wherein a material of the metal mask layer comprises Cu or AlNd.

2. The method according to claim 1, wherein a process of forming the first via hole and removing the remaining metal mask layer comprises:
    etching the portion of the planarization layer exposed by the etching hole using a first etching process to form the first via hole; and
    removing the remaining metal mask layer on the planarization layer using a second etching process different from the first etching process.

3. The method according to claim 2, wherein a process of forming the second via hole comprises:
    coating a photoresist on the planarization layer where the remaining metal mask layer has been removed;
    patterning the photoresist to expose the first via hole;
    etching a portion of the passivation layer exposed by the first via hole using a third etching process to form the second via hole; and
    removing the photoresist on the planarization layer.

4. The method according to claim 3, wherein the first etching process and the third etching process both comprise a dry etching process using a mixed gas of $CF_4$ and $O_2$ as an etching gas, wherein the second etching process comprises a wet etching process using an acidic solution as an etching solution.

5. The method according to claim 4, wherein a gas flow ratio of $CF_4$ to $O_2$ in the mixed gas is 4:1 to 5:1.

6. The method according to claim 1, wherein the metal mask layer has a thickness ranging from 3000 Å to 5000 Å.

7. The method according to claim 1, wherein a thickness of the passivation layer is smaller than a thickness of the planarization layer.

8. The method according to claim 1, wherein an orthographic projection of the etching hole on the base substrate at least partially overlaps an orthographic projection of a source or a drain of the thin film transistor on the base substrate.

9. The method according to claim 1, wherein a process of forming the thin film transistor on the base substrate comprises:
    forming a light shielding layer on the base substrate by a patterning process;
    forming a buffer layer covering the light shielding layer;
    forming an active layer on the buffer layer by a patterning process;
    forming a gate insulating layer and a gate successively on the active layer by a patterning process;
    forming an interlayer dielectric layer by a patterning process, the interlayer dielectric layer covering the buffer layer, the active layer, the gate insulating layer and the gate; and
    forming a source and a drain on the interlayer dielectric layer by a patterning process, the source and the drain being connected to the active layer through via holes in the interlayer dielectric layer respectively.

10. A display substrate manufactured by the method for manufacturing a display substrate according to claim 1, wherein the first via hole and the second via hole communicate with each other, and a size of a top opening of the first via hole is greater than a size of a top opening of the second via hole.

11. The display substrate according to claim 10, wherein a slope angle of the first via hole is smaller than a slope angle of the second via hole.

12. A display panel comprising the display substrate according to claim 10.

13. A display device comprising the display panel according to claim 12.

14. A method for manufacturing a display substrate, comprising:
forming a thin film transistor on a base substrate;
forming a planarization layer covering the thin film transistor;
forming a metal mask layer on the planarization layer;
patterning the metal mask layer to form an etching hole in the metal mask layer, the etching hole exposing a portion of the planarization layer;
etching the portion of the planarization layer exposed by the etching hole to form a first via hole penetrating the planarization layer;
removing a remaining metal mask layer on the planarization layer;
forming, above the base substrate, a passivation layer covering the thin film transistor prior to forming the planarization layer; and
etching a portion of the passivation layer corresponding to the etching hole to form a second via hole penetrating the passivation layer, the second via hole communicating with the first via hole, wherein a material of the metal mask layer comprises Au.

15. The method according to claim 14, wherein a process of forming the first via hole and the second via hole and removing the remaining metal mask layer comprises:
etching the portion of the planarization layer exposed by the etching hole and a portion of the passivation layer corresponding to the etching hole using a fourth etching process to form the first via hole and the second via hole communicating with each other; and
removing the remaining metal mask layer on the planarization layer using a fifth etching process different from the fourth etching process.

16. The method according to claim 15, wherein the fourth etching process comprises a dry etching process using a mixed gas of $CF_4$ and $O_2$ as an etching gas, wherein the fifth etching process comprises a wet etching process using a mixed solution of $I_2$, KI and water as an etching solution.

* * * * *